United States Patent
McClure et al.

(10) Patent No.: US 6,248,958 B1
(45) Date of Patent: Jun. 19, 2001

(54) RESISTIVITY CONTROL OF CIC MATERIAL

(75) Inventors: Bonnie S. McClure, Endwell, NY (US); David B. Stone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/201,482

(22) Filed: Nov. 30, 1998

(51) Int. Cl.[7] ................................................ H05K 3/00
(52) U.S. Cl. ........................ 174/256; 174/255; 29/846; 428/209; 428/901
(58) Field of Search ................................ 174/250, 255, 174/256; 29/840, 846, 856; 428/209, 675, 901

(56) References Cited

U.S. PATENT DOCUMENTS

| | | |
|---|---|---|
| 4,113,578 | 9/1978 | Del Monte . |
| 4,273,859 | 6/1981 | Mones et al. . |
| 4,410,622 | 10/1983 | Dalal et al. . |
| 4,737,418 | 4/1988 | Slattery . |
| 4,830,704 | 5/1989 | Voss et al. . |
| 4,835,593 | 5/1989 | Arnold et al. . |
| 5,128,008 | * 7/1992 | Chen et al. ................ 204/192.15 |
| 5,153,986 | * 10/1992 | Brauer et al. ...................... 29/846 |
| 5,231,751 | * 8/1993 | Sachdev et al. ..................... 29/856 |
| 5,246,731 | 9/1993 | Velie . |
| 5,503,286 | 4/1996 | Nye, III et al. . |
| 5,629,564 | 5/1997 | Nye, III et al. . |
| 5,669,436 | 9/1997 | Papich et al. . |

OTHER PUBLICATIONS

"High Performance Carrier Technology: Materials And Fabrication", by Light et al, 1993 International Electronics Packaging Conference, San Diego, California, vol. 1.

"High Performance Carrier Technology", by Heck et al, 1993 International Electronics Packaging Conference, San Diego, California, vol. 1.

"Process Considerations in the Fabrication of Teflon Printed Circuit Boards", by Light et al, 1994 Proceedings, 44 Electronic Components & Technology Conference, May 1994.

* cited by examiner

*Primary Examiner*—Albert W. Paladini
(74) *Attorney, Agent, or Firm*—Schmeiser, Olsen & Watts; Lawrence R. Fraley

(57) ABSTRACT

A printed circuit board having a diffusion barrier layer between layers of copper-invar-copper material to prevent the migration of nickel, originating from the invar, into the surrounding copper layers is disclosed. A printed circuit board having a diffusion barrier layer between a conductive core and a conductive layer, and a method of forming the printed circuit board are also disclosed.

16 Claims, 2 Drawing Sheets

RESISTIVITY CONTROL OF CIC MATERIAL

BACKGROUND OF THE INVENTION

1. Technical Field

The present invention relates generally to the production of Copper-Invar™-Copper (hereinafter "CIC") material, used in High Performance Chip Carriers (hereinafter "HPCC"), and more particularly, to CIC material having improved resistivity control following high temperature exposures.

2. Related Art

Laminate chip carriers demonstrate the potential of providing the semiconductor industry with high performance, low cost first level packaging. However, packaging assemblies that utilize laminate chip carriers may have poor reliability, due to the mismatch of the Coefficient of Thermal Expansion (hereinafter CTE) between the silicon chips and the first level packaging. If the CTE of the first level package closely matches the CTE of the silicon chip (approximately 3 ppm/° C.), minimal stresses are induced at the interface of these layers. However, the stresses at the interface of the first level and second level may be high, thereby yielding a less reliable package. If the CTE of the first level package matches the CTE of the second level package (approximately 18 ppm/° C.), the stresses will be concentrated at the interface of the silicon chip and the first level carrier. A laminate package containing CIC may be used which has an intermediate CTE (approximately 12 ppm/° C.), which yields an assembly with more balanced stresses and improved reliability. The beneficial effects of the CIC are attributable to the low CTE of the INVAR™, an alloy containing approximately 63.8% iron, 36% nickel and 0.2% carbon.

Although the theoretical electrical conductivity of copper layers in thin CIC is sufficient for use in laminate packaging, CIC has been observed to exhibit reduced conductivity after high temperature processing. This is believed to be caused by the diffusion of nickel, originating from the INVAR™, into the copper layers during heat cycles.

Currently, CIC materials are manufactured using a cladding process in which copper is bonded to the INVAR™ surface at their desired final thickness ratios. The CIC substrate is then rolled, under controlled temperature and pressure, to achieve the final desired thickness. Although this method produces well bonded materials with controlled material ratios, it is time consuming and requires the use of extreme pressures and temperatures, which contribute to the internal stresses within the material. These additional stresses may subsequently be removed by heat treatment procedures, which in turn increase the resistivity of the CIC due to the diffusion of nickel into the copper.

Therefore, there exists a need to develop a laminant chip carrier containing CIC which maintains the electrical conductivity of the constituent copper. Currently, there exists no technique designed to reduce the stresses within the CIC material without increasing the resistivity of the copper.

SUMMARY OF THE INVENTION

The present invention provides a printed circuit board and a method of producing a printed circuit board which overcomes the above-identified problems associated with the use of CIC material in the production of HPCC products.

A first general aspect of the present invention provides a printed circuit board having a diffusion barrier layer between layers of CIC material. The diffusion barrier layer, made of sputtered chromium, remains throughout processing. The diffusion barrier prevents the migration of nickel, originating from the INVAR™, into the surrounding copper layers thereby preventing an increase in resistivity of the CIC material.

A second general aspect of the present invention provides a printed circuit board including a diffusion barrier between a conductive core and a conductive layer. This aspect provides similar advantages to that of the first aspect, and further allows for the use of a similar diffusion barrier layer between conductive materials other than CIC.

A third general aspect of the present invention provides a method of forming a printed circuit board including the steps of providing a conductive core; patterning the conductive core; depositing a diffusion barrier layer thereon; depositing a conductive layer thereon; and applying a non-conductive layer. This aspect of the process allows for a method of forming a printed circuit board containing a diffusion barrier layer therein, and provides similar advantages referred to in the first aspect.

It is therefore an advantage of the present invention to provide a micro thin chromium diffusion barrier between layers of the CIC material, which remains throughout processing, to prevent the migration of nickel into the copper and thereby improve resistivity and maintain the mechanical and electrical properties of the material.

It is therefore a further advantage of the present invention to provide a manner of reducing the stresses within the CIC without increasing resistivity.

It is a further advantage of the present invention to start with a layer of INVAR™, at its final desired thickness, and sputter deposit layers of chromium and copper such that the CIC formed is of the desired final thickness, thereby eliminating the need for subsequent rolling processes.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

Figure 1:
FIG. 1 depicts an INVAR™ substrate 10 in accordance with the present invention.
Figure 2:
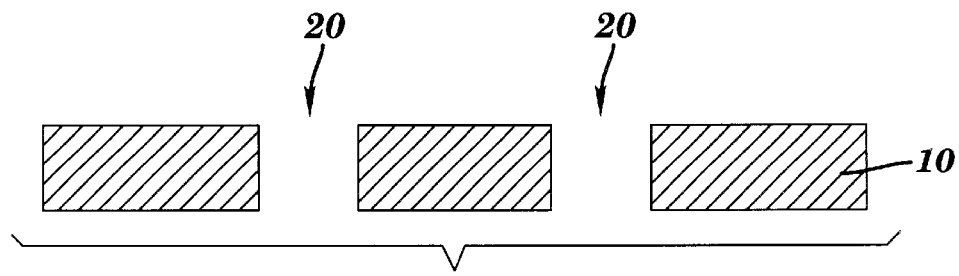
FIG. 2 depicts an INVAR™ substrate 10 having throughholes 20 etched therein in accordance with the present invention.

Referring to FIG. 1, a conductive core of INVAR™ 10 of a final desired thickness in accordance with the present invention is shown. INVAR™ 10 is patterned to form at least one throughhole 20 for electrical connections therein, as depicted in FIG. 2, using a standard etching process. As an example, this process may include the deposition of a photo-imagable resist, which is selectively exposed to light or other ionizing radiation, i.e., ultraviolet light, electron beams, X-rays, and so on. The exposed resist is then developed by washing the substrate in a basic developer solution. Either a positive or negative (photo)-resist may be used. In the event negative imaging resist is used, the developer will remove the non-irradiated portions of the resist layer. In a positive resist imaging process, the developer would remove the irradiated portions of the resist layer.

INVAR™ 10 may then be pre-treated using conventional methods known in the art. For instance, INVAR™ 10 may be pre-cleaned by a scrubbing process using an organic cleaning solution. This step is designed to remove grease and fingerprints, thereby enhancing the adhesion of subsequently deposited materials and maintaining the integrity of the material's mechanical properties. The cleaned INVAR™ 10 is then preheated at approximately 150 ° C. to further enhance adhesion.

Figure 3:
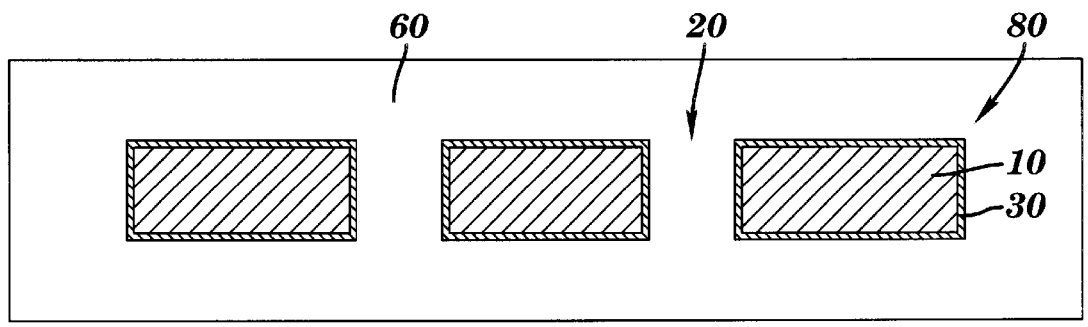
FIG. 3 depicts a vacuum chamber 60 containing a cross-sectional view of a conductive core of INVAR™ 10 with a thin diffusion barrier layer of chromium 30 deposited thereon in accordance with the present invention.

As depicted in FIG. 3, INVAR™ 10 is then placed in a vacuum chamber 60 of a standard sputtering apparatus. The chamber is evacuated and then filled with an inert gas atmosphere, typically argon, although other gases or gaseous mixtures may be used. A continual flow of gas into vacuum chamber 60 is maintained throughout the following processes, and at no time is vacuum chamber 60 infiltrated with outside air.

Next, a micro thin chromium layer 30 is sputtered onto the top and bottom surfaces of INVAR™ 10 to form INVAR™-chromium substrate 80. Chromium layer 30 is deposited preferably at approximately 800 angstrom, and should be deposited onto both top and bottom surfaces simultaneously to prevent INVAR™ 10 from curling or becoming twisted. Chromium layer 30 functions as a permanent diffusion barrier which remains throughout the duration of the processing.

Sputtering may be carried out using either direct voltage (DC) or radio frequency voltage (RF). DC voltage sputtering is desirable from a power supply point of view, however, it requires high temperatures and pressures which makes it less desirable than RF voltage sputtering, especially for this application. For the purposes of the present invention, RF voltage sputtering is preferred, although either method may be used.

Figure 4:
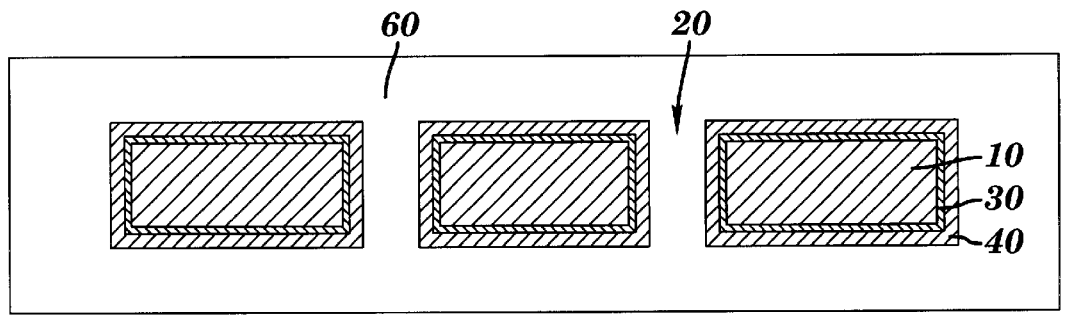
FIG. 4 depicts a vacuum chamber 60 containing a cross-sectional view of a conductive layer of copper 40 deposited onto the INVAR™-chromium substrate in accordance with the present invention.

FIG. 4 shows the INVAR™-chromium substrate 80 with a copper layer 40 sputtered thereon. In particular, copper layer 40 is sputtered onto chromium layer 30 within the same vacuum chamber 60. Copper layer 40 is deposited at its final desired thickness, approximately 0.25 mils, on each side of INVAR™-chromium substrate 80 for a total thickness of approximately 0.5 mils of copper. As with chromium layer 30, copper layer 40 should be deposited onto both top and bottom surfaces of INVAR™-chromium substrate 80 simultaneously to prevent curling. The CIC substrate with diffusion barrier has a final thickness of approximately 2.0 mils.

Figure 5:
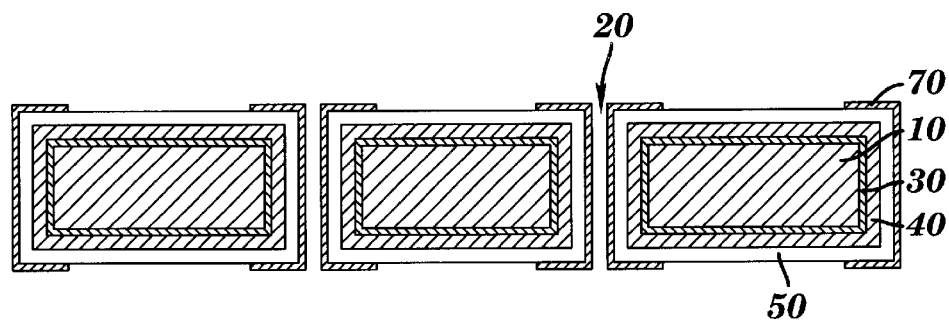
FIG. 5 depicts a cross-sectional view of a non-conductive layer deposited onto the CIC material and copper coated throughholes 20 in accordance with the present invention.

FIG. 5 shows the printed circuit board formed by the present invention. The CIC material is removed from vacuum chamber 60 and a non-conductive layer 50 is deposited thereon by a process known in the art. The non-conductive layer 50 may be a dielectric material selected from any of a group of the insulators known in the field, e.g., polymers, thermosets, thermoplastics, resins, etc. Preferably, non-conductive layer 50 is deposited by a lamination process in which the CIC material is placed between two layers of dielectric under applied heat and pressure. The thickness of this layer may range from approximately 1.0 to 3.0 mils. Although this is the preferred method of deposition used in the present invention, other methods known in the art may be used. Throughholes 20 are then coated with a thin layer of copper 70, to form electrical connections. The final thickness of the printed circuit board is approximately 6.0 mils.

Sputtering was selected in the present invention to deposit chromium layer 30 and copper layer 40 because it is capable of depositing a thin layer, thereby using less material than other methods and allowing for the deposition of a thin micro layer of the chromium. Additionally, sputtering is the preferred method because it is well known to promote adhesion between metal layers. However, other methods of metal deposition may be used since the teachings of this invention are not limited to the use of sputtering.

Chromium is preferred in the present invention to prevent the migration of nickel because it performs well as a diffusion barrier between metals. Further chromium was selected because it exhibits strong adhesion properties, particularly with copper. However, the diffusion barrier of the present invention is not limited to the use of chromium. Many other materials exhibiting these desired qualities may be used in place of chromium.

It is an advantage of the present invention to pattern INVAR™ 10 prior to the deposition of chromium layer 30 and copper layer 40 because smaller throughholes 20 may be formed more easily at that point.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A printed circuit board comprising:

a diffusion barrier layer between an INVAR core and a copper layer.

2. The printed circuit board of claim 1, wherein the diffusion barrier layer is chromium.

3. The printed circuit board of claim 1, wherein the printed circuit board has a thickness of approximately 2.0 mils.

4. The printed circuit board of claim 1, wherein the diffusion barrier layer is deposited at approximately 800 angstrom.

5. The printed circuit board of claim 1, wherein the diffusion barrier layer is deposited by sputtering.

6. A printed circuit board comprising:

a diffusion barrier between a conductive INVAR core and a conductive copper layer, wherein the diffusion barrier prevents diffusion of INVAR into the copper layer.

7. A method of forming a printed circuit board comprising the steps of:

provadding an INVAR core;

patterning the core to form through holes;

depositing a diffusion barrier layer thereon to prevent the INVAR from diffusing into subsequent layers;

depositing a copper layer thereon;

applying a non-conductive layer; and depositing copper within the through holes.

8. The method of claim 7, wherein the has a thickness of approximately 1.5 mils.

9. The method of claim 7, wherein the core is patterned using an etching process.

10. The method of claim 7, wherein the diffusion barrier layer is chromium.

11. The method of claim 10, wherein the diffusion barrier layer is deposited at approximately 800 angstrom.

12. The method of claim 7, wherein the copper layer has a thickness of approximately 0.25 mils.

13. The method of claim 7, wherein the non-conductive layer is a dielectric material.

14. The method of claim 13, wherein the dielectric material is selected from a group consisting of: polymers, thermosets, thermoplastics, and resins.

15. The method of claim 7, wherein the printed circuit board has a thickness of approximately 6.0 mils.

16. The method of claim 7, wherein the diffusion barrier layer and the conductive layer are deposited by sputtering.

\* \* \* \* \*